(12) United States Patent
Anand et al.

(10) Patent No.: US 6,552,938 B1
(45) Date of Patent: Apr. 22, 2003

(54) COLUMN REDUNDANCY SYSTEM AND METHOD FOR EMBEDDED DRAM DEVICES WITH MULTIBANKING CAPABILITY

(75) Inventors: Darren L. Anand, Essex Junction, VT (US); John E. Barth, Jr., Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/971,840

(22) Filed: Oct. 5, 2001

(51) Int. Cl.[7] .................................................. G11C 7/00
(52) U.S. Cl. .............. 365/200; 365/230.06; 365/230.02
(58) Field of Search .......................... 365/200, 189.02, 365/230.02, 230.06, 191, 189.08, 225.7

(56) References Cited

U.S. PATENT DOCUMENTS

| | | | | |
|---|---|---|---|---|
| 5,673,227 A | * | 9/1997 | Engles et al. .......... | 365/189.02 |
| 5,796,662 A | | 8/1998 | Kalter et al. | |
| 6,055,204 A | * | 4/2000 | Bosshart ................ | 365/189.02 |
| 6,160,302 A | | 12/2000 | Palagonia | |

* cited by examiner

Primary Examiner—David Nelms
Assistant Examiner—Thong Le
(74) Attorney, Agent, or Firm—James Cioffi; Cantor Colburn LLP

(57) ABSTRACT

A column redundancy system is disclosed for a memory array having a page structure organized into columns and data lines. In an exemplary embodiment of the invention, the system includes a steering logic network for coupling a memory input/output (I/O) device to the memory array. A storage register is in communication with the steering logic network, the storage register for storing location information for defective data lines in the memory array. During a memory operation, the location information stored in the storage register is transmitted to the steering logic network, the storage register further having the location information loaded therein prior to the memory operation. Thereby, the steering logic network prevents any of the defective data lines from being coupled to the I/O device.

20 Claims, 5 Drawing Sheets

COLUMN REDUNDANCY SYSTEM AND METHOD FOR EMBEDDED DRAM DEVICES WITH MULTIBANKING CAPABILITY

BACKGROUND

The present invention relates generally to integrated circuit memory devices and, more particularly, to a column redundancy system and method for embedded dram (eDRAM) devices with multibanking capability.

The discarding or scrapping of defective integrated circuits when defects are identified is economically undesirable, particularly if only a small number of circuit elements are actually defective. In addition, relying on a "zero defect" goal in the fabrication of integrated circuits is an unrealistic expectation from a practical standpoint. Accordingly, redundant circuit elements are provided on integrated circuits to reduce the number of discarded integrated circuits. If a primary circuit element is determined to be defective during testing, a redundant circuit element is substituted for the defective primary circuit element. Substantial reductions in scrapped devices may be achieved by using redundant circuit elements without substantially increasing the cost of the integrated circuit.

One example of a type of integrated circuit device that uses redundant circuit elements is integrated memory circuits, such as dynamic random access memories (DRAMs). These devices typically include millions of individual memory cells arranged in arrays of addressable rows and columns. The rows and columns of memory cells are the primary circuit elements of the integrated memory circuit. By providing redundant circuit elements, either as rows or columns, defective primary rows or columns can be replaced.

Because the individual primary circuit elements (rows or columns) of an integrated memory circuit are separately addressable, replacing a defective circuit element typically involves blowing fuse-type devices in order to "program" a redundant circuit element to respond to the address of the defective primary circuit element. This process is very effective for permanently replacing defective primary circuit elements. In the case of DRAMs, for example, a particular memory cell is selected by first providing a unique row address corresponding to the row in which the particular memory cell is located and subsequently providing a unique column address corresponding to the column in which the particular memory cell is located. When the address of the defective primary circuit element is presented by the memory customer (user), the redundancy circuitry must recognize this address and thereafter reroute all signals to the redundant circuit element.

As new and improved memory products are developed (e.g., embedded DRAM with multibanking capability), the speed of a column redundancy system should correspondingly "keep up" with the speed of the new designs. In other words, it is undesirable to have a column redundancy system either negate or limit the performance of a data path as data is moved in and out of a memory array.

BRIEF SUMMARY

The above discussed and other drawbacks and deficiencies of the prior art are overcome or alleviated by a column redundancy system for a memory array having a page structure organized into columns and data lines. In an exemplary embodiment of the invention, the system includes a steering logic network for coupling a memory input/output (I/O) device to the memory array. A storage register is in communication with the steering logic network, the storage register for storing location information for defective data lines in the memory array. During a memory operation, the location information stored in the storage register is transmitted to the steering logic network, the storage register further having the location information loaded therein prior to the memory operation. Thereby, the steering logic network prevents any of the defective data lines from being coupled to the I/O device.

In a preferred embodiment, the location information is generated by programming programmable fuse devices included in the memory array, and the defective memory element location is decoded from a binary signal representation to a thermometric signal representation. The steering logic includes a series of multiplexing devices therein, the multiplexing devices capable of selectively routing the data lines in the memory array to corresponding data lines in the I/O device. If a first defective data line is detected in the memory array, then the steering logic prevents the first defective data line from being coupled to its corresponding data line in the I/O device. Furthermore, data lines subsequent to the first defective data line in the memory array are coupled by the steering logic to corresponding data lines in the I/O device in accordance with a one position shift.

If a second defective data line is detected in the memory array, then the steering logic prevents the second defective data line from being coupled to its corresponding data line in the I/O device. Then, data lines subsequent to the second defective data line in the memory array are coupled to corresponding data lines in the I/O device in accordance with a two position shift.

The column redundancy system preferably further includes carrying logic coupled with the storage register, the storage register further providing a first switching signal to the steering logic network and the carrying logic providing a second switching signal to the steering logic network. The first and second switching signals determine whether a data line in the memory array is connected in a first, second or third position with respect to a corresponding data line in the I/O device.

BRIEF DESCRIPTION OF THE DRAWINGS

Referring to the exemplary drawings wherein like elements are numbered alike in the several Figures.

DETAILED DESCRIPTION

Figure 1A:
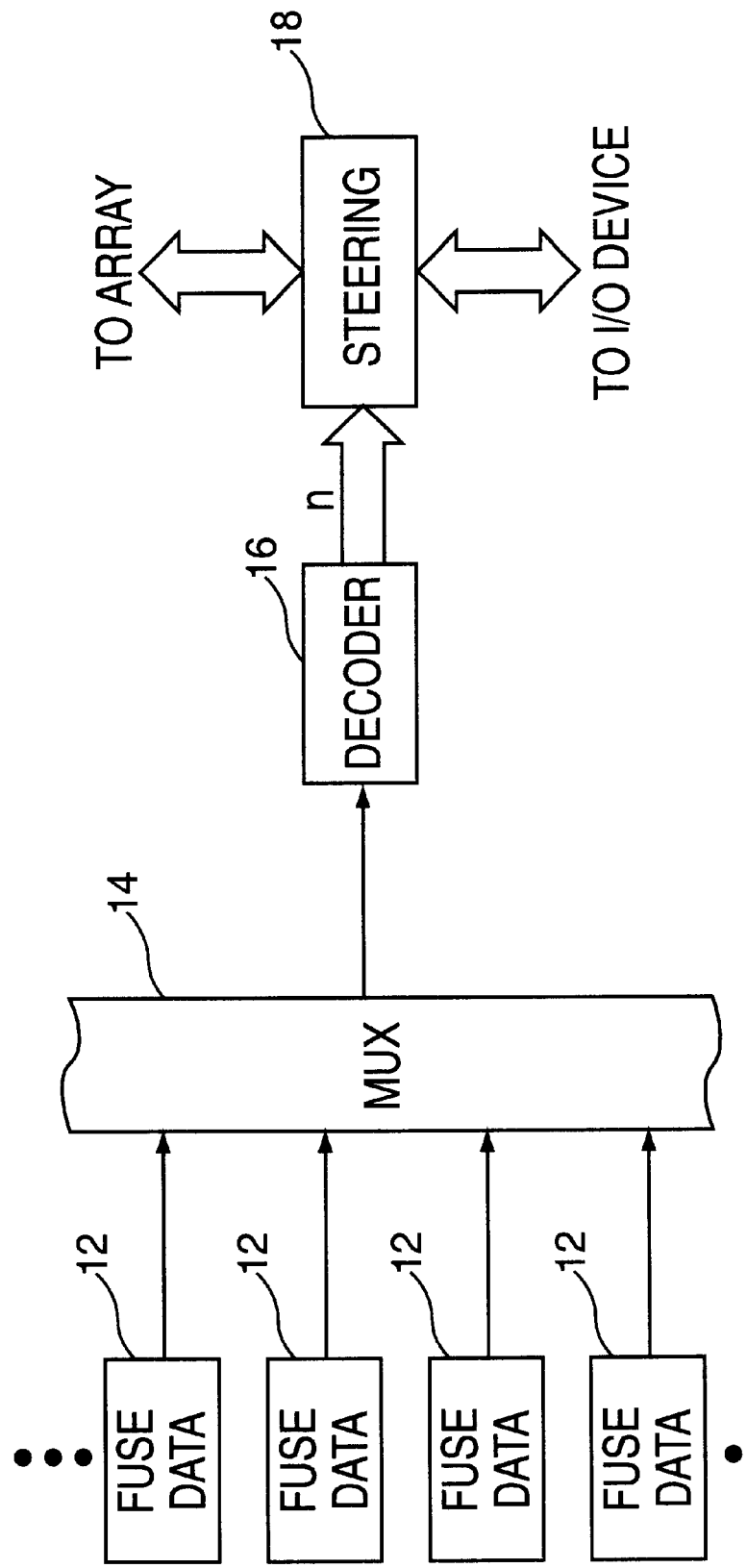
FIG. 1(a) is a block diagram of an existing column redundancy system which may be implemented for a block of embedded DRAM (eDRAM)

Referring initially to FIG. 1(a), there is shown a block diagram of an existing column redundancy system 10 which may be implemented, for example, within a block of embedded DRAM (eDRAM). Within a given 1 Mb eDRAM block, one example of a possible memory page configuration includes 256 datalines each having 8 column addresses. Included within the array structure will be, for example, 8 spare datalines (2 assigned to each of four groups of 64 data lines). If a particular data line in a group is found to be defective, that line will be replaced by one of the 2 spare data lines. In such a case, this information is recorded and accessed by the user, so that the spare data line will be used in read/write operations.

In the redundancy system of FIG. 1(a), a series of pre-programmed fuse data storage elements 12 (containing individual latches therein) is associated with remotely located, individual memory array blocks. Thus, for a 4 Mb eDRAM, there may be four individual 1 Mb memory array blocks, each having fuse data associated therewith. The fuse data 12 contains redundancy information (i.e., which if any data lines are to be replaced) for its corresponding memory array block. A multiplexer 14 receives the fuse data and selects the appropriate set of fuse data 12 when a specific memory block is to be accessed. The multiplexed data is then sent to a thermometric decoder 16 for converting binary coded data lines to thermometric code used by steering logic 18 to correctly route the data to and from the memory array blocks. As will be described in greater detail hereinafter, the steering logic 18 is essentially a series of braided, individual 3 to 1 multiplexers (switches) that determine a connection path between a given data line on the array side of the steering logic 18 and one of three possible corresponding data lines on the I/O side of the logic. The specific connection of the three possible connections to an I/O side data line is dependent upon the particular fuse data associated with an array block.

By way of a simplified example, it will be assumed that a group of data lines for a subject memory array block contains eight normal data lines (numbered 0–7) and two redundant data lines (numbered 8–9). Thus, as shown in the switching diagram of FIG. 1(b), there can be at most two defective data lines in the array for it to be useable. It will further be assumed that the third data line (number 2) in the array is defective and has been accordingly flagged by an appropriate fuse data device. In this simplified example, therefore, a set of "fuse" bits will be encoded with "0010", which is the binary representation of data line 2. (It will be noted that four bits are used for this binary representation since there are ten total data lines in the example.) Because data line 2 in the subject array is defective, it is not connected to corresponding data line 2 from an I/O device. Instead, data line 3 in the array is shifted over one position to connect to data line 2 in the I/O device. As a result, each successive data line in the array must also be shifted over one position. In other words, beginning with data line 3 on the array side of steering logic 18, each successive data line N on the array side is rerouted to data line N−1 on the I/O side of steering logic 18. Alternate array data line 8 is thus rerouted to the last data line (7) on the I/O side of steering logic 18.

In order for this switching configuration to be executed by steering logic 18, the binary fuse data signal (0010) is transmitted (through multiplexer 14) to thermometric decoder 16, where it is converted into the ten-bit thermometric code (0011111111). The thermometric code reflects that array data line 2 is defective and is not connected to is corresponding I/O side data line 2. Thereafter, the remaining good array data lines are switched over by one (N−1) position with respect to the I/O side data lines. Again, in this simplified example, the thermometric code comprises ten bits, one bit for each data line and redundant data line in the array. In an actual device, a 64-bit data line grouping (with two spare lines) would have a 66-bit thermometric signal as an input to the steering logic 18. The thermometric code generated by decoder 16 is then sent to steering logic 18, where the appropriate switching signals generated therein execute the switch configuration shown in FIG. 1(b). Additional details regarding a three-way data line multiplexer (e.g., possible switch positions N, N−1, N−2) may be found in U.S. Pat. No. 5,796,662, the contents of which are incorporated herein by reference.

As indicated above, a conventional array block allows for two defective data lines. Thus, there is the possibility that there will be two such defective data lines. An example of this condition is shown in the switching diagram of FIG. 1(c), where, in addition to data line 2, data line 5 in the array is also defective.

Because data line 5 in the array is also defective, it will not be connected to data line 4 on the I/O side of steering logic 18. Instead, data line 6 in the array is now routed two places over to data line 4 on the I/O side. Therefore, beginning with data line 6 on the array side of steering logic 18, each successive data line N on the array side is now rerouted to data line N−2 on the I/O side of steering logic 18. As a result, both alternate data lines 8 and 9 in the array are now used. As is the case with the example of FIG. 1(b), the steering logic 18 must receive this information (about defective data line 5) from the stored fused data. A second stored binary code (0110) is thus multiplexed and sent for thermometric decoding. Although not shown, the system of FIG. 1(a) actually uses a second thermometric decoder to decode a separate fuse data signal in the event a second defective data line exists. The thermometric output from this second decoder, accordingly, is (0000011111). This time, however, the first "1" in the second thermometric code indicates the location of the second bad data line in the array, and the remaining 1's indicate an N−2 shift for the subsequent good data lines.

Figure 1B:
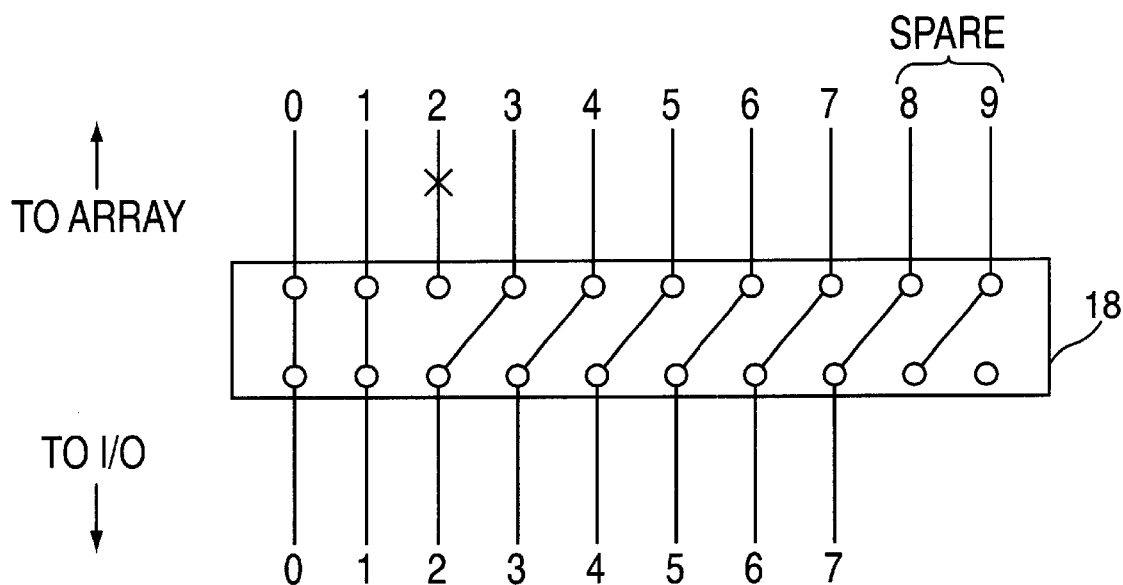
FIG. 1(b) is a switching diagram illustrating one example of the operation of steering logic used in column redundancy systems.
Figure 1C:
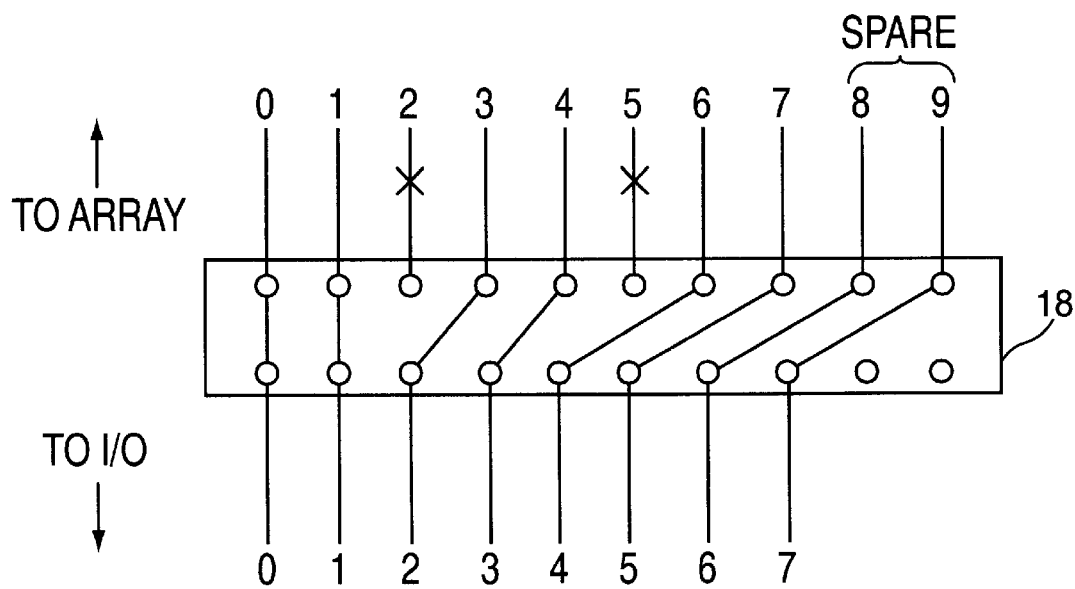
FIG. 1(c) is a switching diagram illustrating another example of the operation of steering logic used in column redundancy systems.

It will be appreciated that the redundancy system of FIG. 1(a), as illustrated by the simplified examples in FIGS. 1(b) and 1(c), involves a series of signal processing steps which take a certain amount of time to complete. In addition, the fact that these fuse data storage elements 12 are remotely located with respect to the other redundancy system elements further increases the amount of time used to complete an operation. With the above system, a column replacement solution may be completed on the order of about 5 ns. Although such a speed is suitable for some existing memory configurations, certain newer DRAM designs take advantage of multibanking of memory blocks. Unfortunately, however, the time taken to transmit the remotely located fuse data is too long to be implemented with eDRAM having multibanking capability, given a single block of column redundancy logic to be used by all blocks.

Figure 2A:
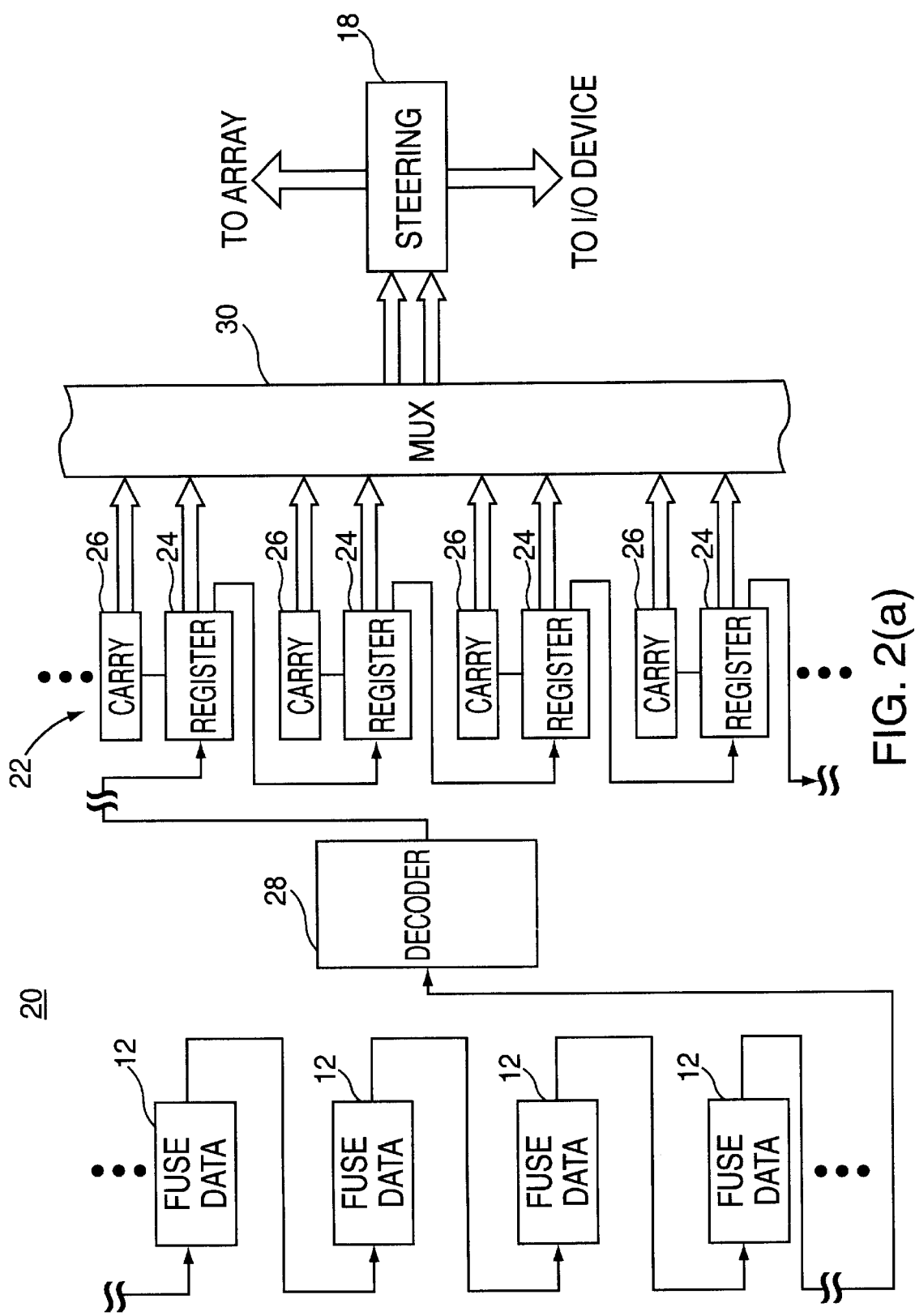
FIG. 2(a) is a block diagram of a column redundancy system, in accordance with an embodiment of the invention.

Therefore, a novel system and method is disclosed that improves the speed at which a single column redundancy element services a plurality of memory array blocks. Referring now to FIG. 2(a), there is shown a block diagram illustrating a column redundancy system 20, in accordance with an embodiment of the invention. Broadly stated, system 20 (in lieu of remotely extracting fuse data and passing the same through a decoding process and a multiplexing process as part of a read/write operation cycle) employs a register array to store a compressed version of the thermometric output of a pair of thermometric decoders 16. Thereby, the thermometric code is "pregenerated" and stored for use by the local steering logic so as to eliminate the time otherwise used doing the same during a read/write cycle.

As shown in FIG. 2(a), a register array 22 includes a series of individual shift registers 24 along with accompanying carry logic 26. The carry logic 26, described in greater detail later, is used in conjunction with shift registers 24 to provide an additional control bit to steering logic 18 for the determination of one of three possible switch positions for a given array data line (or, if bad, than an open circuit connection). Each shift register 24 has thermometrically decoded fuse data bits inputted thereto from a thermometric decoder 28. In a preferred embodiment, the decoded fuse data bits are serially loaded into (and decoded by) a single decoder 28, the output of which is serially loaded into shift registers 24. In the embodiment shown in FIG. 2(a), device real estate is saved by using a single decoder 28 for all of the fuse data bits.

Figure 2B:
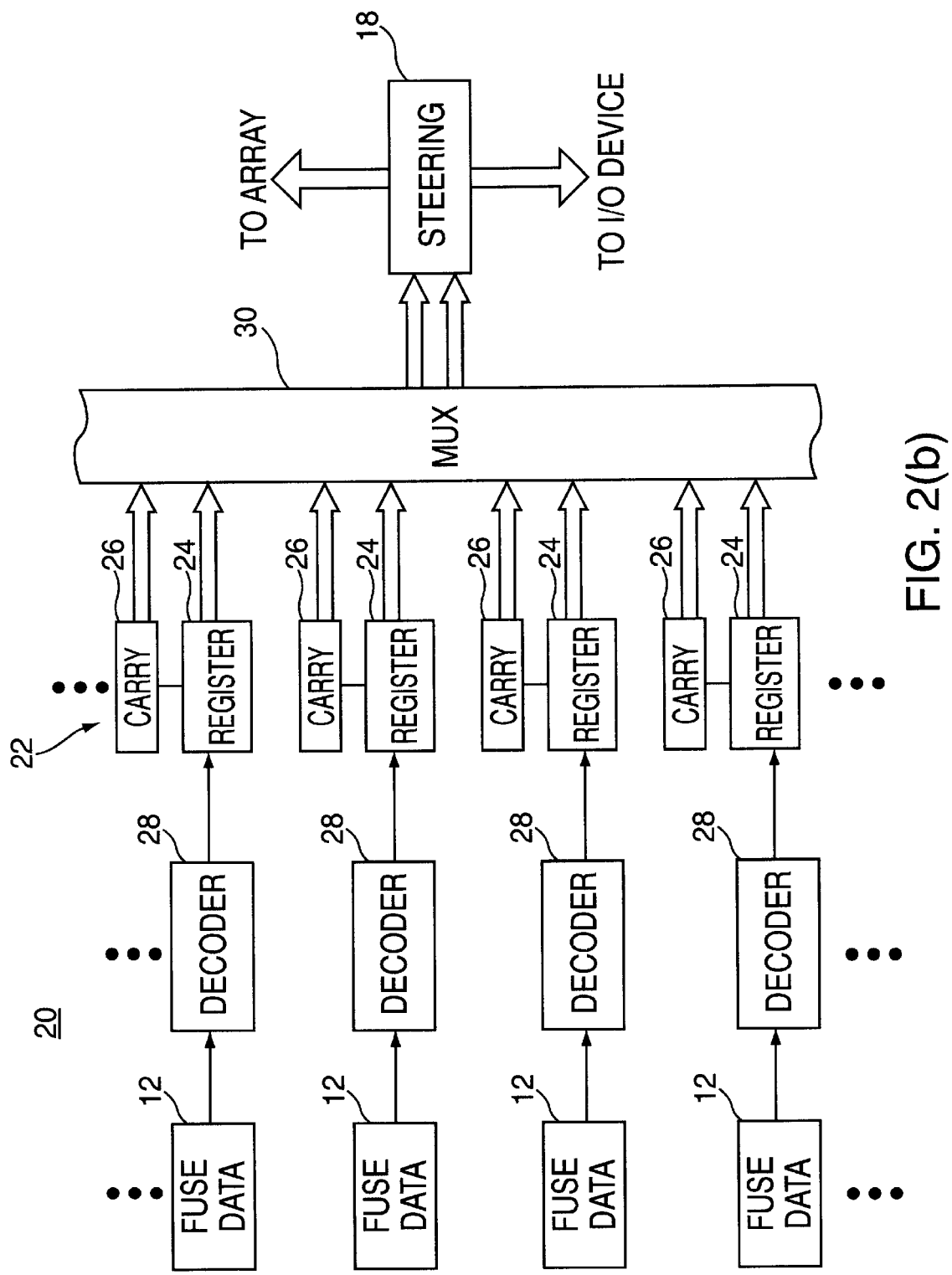
FIG. 2(b) is an alternative embodiment of the block diagram of FIG. 2(a)

Alternatively, as shown in FIG. 2(b), the fuse data bits may be inputted into individual thermometric decoders 28 for parallel loading into the shift registers 24. That is, for each memory bank or block within a memory device the data stored in the appropriate fuse structure will be sent to a separate decoder 28, decoded, and then stored in a corresponding shift register 24. Although in this embodiment the fuse data loading process (during system power up) is completed in a shorter period of time, the trade off is the amount of device real estate used for the dedication of multiple thermometric decoders 28.

Still an alternative possibility is to use a single decoder 28 in conjunction with a multiplexer and counter device (not shown) to load the register array 22 one shift register 24 at a time upon power up of the system. Regardless of which of the above described embodiments are implemented, the thermometric fail data for each array block, once loaded at power up, is readily accessible by steering logic 18 through multiplexer 30 during memory operations.

Figure 3A:
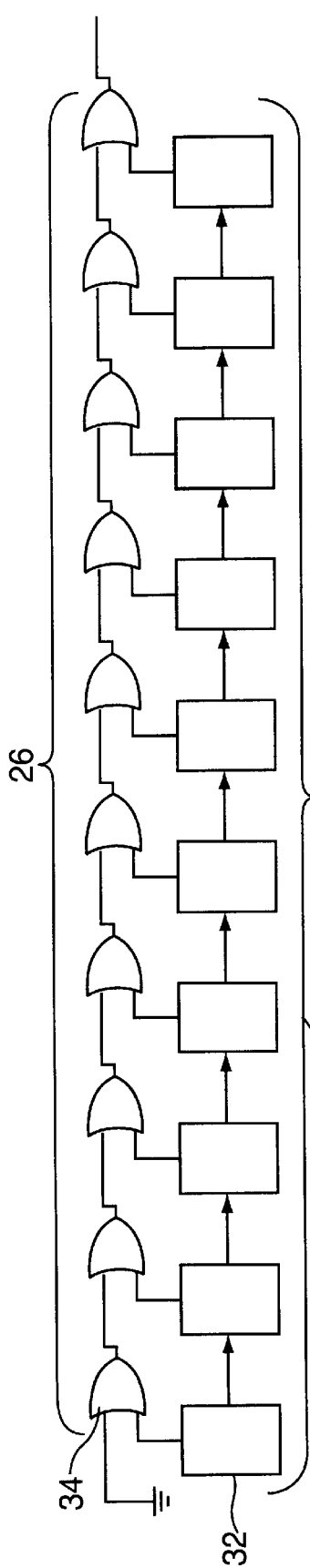
FIG. 3(a) is a schematic diagram of an exemplary shift register and carry logic associated therewith, as shown in FIGS. 2(a) and 2(b)

Referring now to FIG. 3(a), there is shown a schematic diagram of an exemplary shift register 24 and carry logic 26 associated therewith, as depicted in FIGS. 2(a) and (b). Shift register 24 has a plurality individual storage latches 32, which receives the inputted thermometric code therein. The carry logic 26 includes a plurality of OR gates 34 corresponding to the number of storage latches. Again, for a memory array having a total of X "normal" data lines and Y redundant data lines, each register 24 will have (X+Y) latches 32 therein and the carry logic 26 will include (X+Y) OR gates 34 therein. In keeping with the example described earlier, it will be assumed that a memory block configuration includes a total of ten array data lines (including 2 redundant data lines). Thus, FIG. 3(a) illustrates ten latches 32 and ten OR gates 34.

Each OR gate 34 has the data stored in a corresponding one of the latches 32 as a first input thereto. Except for the first OR gate, the carry output from the previous OR gate serves as the second input thereto. The outputs of each OR gate are used as one of the two control inputs to the individual MUXs in steering logic 18. The other control input will be the value of the data stored in each latch 32.

Figure 3B:
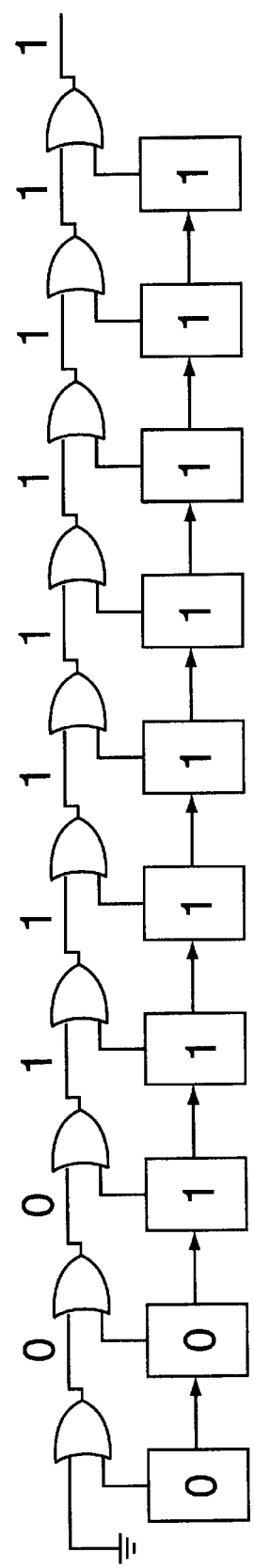
FIG. 3(b) is a schematic diagram of the shift register and carry logic of FIG. 3(a), as programmed according to the switching example illustrated in FIG. 1(b)
Figure 3C:
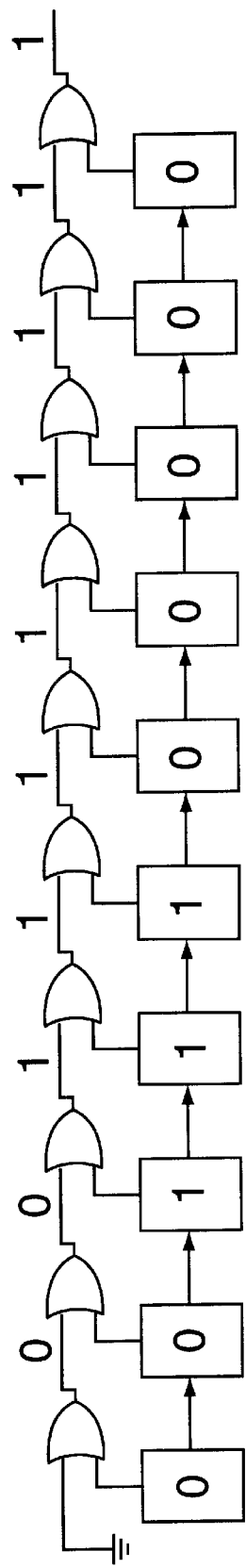
FIG. 3(c) is a schematic diagram of the shift register and carry logic of FIG. 3(a), as programmed according to the switching example illustrated in FIG. 1(c).

The operation of the register 24 and carry logic 26 will be understood with reference to FIGS. 3(b) and 3(c). In FIG. 3(b), there is shown the specific logic state of register 24 and carry logic 26 that will drive the switching configuration example illustrated in FIG. 1(b). That is, array data line 2 is bad and the remaining array data lines are shifted N−1 positions to a corresponding I/O data line. It will be noted that the ten register latches 34 in FIG. 3(b) store the thermometric code therein corresponding to a bad data line 2, namely (0011111111).

With only one (or no) bad data lines, the significance of the carry input is not immediately apparent. Obviously, with no bad data lines, the entire register would contain 0's therein, as well as the values of the carry inputs. The switching logic would not execute any shifting, and array data line N would be connected to corresponding I/O data line N, for all values of N. If there is one bad array data line, the location thereof is identified by a transition from 0 to 1 in the register. Thereafter, the remaining 1's indicate that each subsequent array data line is shifted by N−1 positions.

On the other hand, if there are two bad array data lines, then an additional bit (other than the one stored in the latches 34) is needed to distinguish the third possible switch position, shift by N−2. This is where the function of the carry logic 26 comes into play. As illustrated in FIG. 3(c), the register is now loaded with the thermometric data corresponding to the example of FIG. 1(c), where both data array lines 2 and 5 are bad.

The carry logic 26 allows a first bad array data line to be identified by a transition from "0" to "1" in the register 24. A second bad array data line will be identified by a transition from "1" to "0" in the register 24. However, since the initial transition from "0" to "1" causes a "1" to be propagated through the remainder of the carry logic 26, the second transition from "1" to "0" is distinguished from no transition at all if no bad data lines exist. In other words, the carry logic 26 allows the steering logic 18 to distinguish between a series of 0's representing no shift from a series of 0's representing a shift by N−2. If the register bit is "0" and the carry bit is "0", then a good array data line will not be shifted. If the register bit is "1" and the carry bit is "1", then a good array data line will be shifted by N−1. Finally, if the register bit is "0" and the carry bit is "1", then a good array data line will be shifted by N−2.

The carry logic 26 enables the storage of two failing array data lines in a single register, thereby using half as many storage latches as in a conventional redundancy system. However, in lieu of the carry logic, two shift registers could also be used to perform an equivalent function. One register would contain information about a first bad array data line, and another register would contain information about a second bad data line. The multiplexing device in steering logic would still have a two signal input for an array data line.

Regardless of whether one or two shift registers are used, the key to saving time over a conventional redundancy system is that the shift registers are loaded with the decoded fuse data during power up of the entire system. Although the use of carry logic 26 is a relatively slow procedure, the performance of the column redundancy system 10 is not impacted because the registers are already loaded by the time operations of the memory array are commenced. This is in contrast to the conventional redundancy systems, where time is taken during memory operations to retrieve the fuse data from the remotely located fuse elements, decode the data, and then send it to the steering logic. Under worst case conditions, column redundancy system 10 has been shown to operate as high as 400 MHz (2.5 ns cycle), which allows for the desired multibanking of eDRAM.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A column redundancy system for a memory array having a page structure organized into columns and data lines, the system comprising:
   a steering logic network for coupling a memory input/output (I/O) device to the memory array; and
   a storage register in communication with said steering logic network, said storage register for storing decoded location information for defective data lines in the memory array;
   wherein, during a memory operation, said decoded location information stored in said storage register is transmitted to said steering logic network, said storage register further having said decoded location information loaded therein prior to said memory operation, and said steering logic network thereby preventing any of said defective data lines from being coupled to said I/O device.

2. The column redundancy system of claim 1, wherein:
   said location information is generated by programming programmable fuse devices included in the memory array; and
   said defective memory element location is decoded from a binary signal representation to a thermometric signal representation.

3. The column redundancy system of claim 2, wherein:
   said steering logic network includes a series of multiplexing devices therein, said multiplexing devices capable of selectively routing the data lines in the memory array to corresponding data lines in said I/O device.

4. The column redundancy system of claim 3, wherein:
   if a first defective data line is detected in the memory array, then said steering logic prevents said first defective data line from being coupled to its corresponding data line in said I/O device; and
   data lines subsequent to said first defective data line in the memory array are coupled by said steering logic to corresponding data lines in said I/O device in accordance with a one position shift.

5. The column redundancy system of claim 4, wherein:
   if a second defective data line is detected in the memory array, then said steering logic prevents said second defective data line from being coupled to its corresponding data line in said I/O device; and
   data lines subsequent to said second defective data line in the memory array are coupled to corresponding data lines in said I/O device in accordance with a two position shift.

6. The column redundancy system of claim 1, further comprising:
   carrying logic coupled with said storage register, said storage register further providing a first switching signal to said steering logic network and said carrying logic providing a second switching signal to said steering logic network;
   wherein said first and second switching signals determine whether a data line in the memory array is connected in a first, second or third position with respect to a corresponding data line in said I/O device.

7. The column redundancy system of claim 6, wherein:
   said carrying logic comprises a series of OR gates coupled to a series of latches in said storage register;
   wherein, for an array page structure having a number, n, of normal data lines and redundant data lines, said storage register comprises n latches and n OR gates.

8. An integrated circuit device, comprising:
   a memory array configured into a series of individual memory blocks, each of said memory blocks having a page structure organized into columns and data lines; and
   a column redundancy system serving each of said memory blocks in said memory array, said column redundancy system further comprising:
      a steering logic network for coupling a memory input/output (I/O) device to each of said memory blocks in said memory array; and
      a storage register in communication with said steering logic network, said storage register for storing decoded location information for defective data lines in said memory blocks;
      wherein, during a memory operation, said decoded location information stored in said storage register is transmitted to said steering logic network, said storage register further having said decoded location information loaded therein prior to said memory operation, and said steering logic network thereby preventing any of said defective data lines from being coupled to said I/O device.

9. The integrated circuit device of claim 8, wherein:
   said location information is generated by programming programmable fuse devices included in said memory blocks; and
   said defective memory element location is decoded from a binary signal representation to a thermometric signal representation.

10. The integrated circuit device of claim 9, wherein:
    said steering logic includes a series of multiplexing devices therein, said multiplexing devices capable of selectively routing said data lines in said memory blocks to corresponding data lines in said I/O device.

11. The integrated circuit device of claim 10, wherein:
    if a first defective data line is detected in one of said memory blocks, then said steering logic prevents said first defective data line from being coupled to its corresponding data line in said I/O device; and
    data lines subsequent to said first defective data line in said one of said memory blocks are coupled by said steering logic to corresponding data lines in said I/O device in accordance with a one position shift.

12. The integrated circuit device of claim 11, wherein:
    if a second defective data line is detected in said one of said memory blocks, then said steering logic prevents said second defective data line from being coupled to its corresponding data line in said I/O device; and
    data lines subsequent to said second defective data line in said one of said memory blocks are coupled to corresponding data lines in said I/O device in accordance with a two position shift.

13. The integrated circuit device of claim 8, further comprising:

carrying logic coupled with said storage register, said storage register further providing a first switching signal to said steering logic network and said carrying logic providing a second switching signal to said steering logic network;

wherein said first and second switching signals determine whether a data line in one of said memory blocks is connected in a first, second or third position with respect to a corresponding data line in said I/O device.

14. The integrated circuit device of claim 13, wherein:

said carrying logic comprises a series of OR gates coupled to a series of latches in said storage register;

wherein, for memory block page structure having a number, n, of normal data lines and redundant data lines, said storage register comprises n latches and n OR gates.

15. A method for bypassing a defective memory element in a memory array, the method comprising:

configuring a storage register in communication with a steering logic network, said steering logic network for coupling a memory input/output (I/O) device to the memory array;

loading said storage register with decoded defective element location information; and during a memory operation, transmitting said decoded defective element information from said storage register to said steering logic network, said storage register having said decoded defective location information loaded therein prior to said memory operation;

wherein said steering logic network is caused to prevent the defective memory element from being coupled to said I/O device.

16. The method of claim 15, further comprising:

identifying said defective memory element location by programming programmable fuse devices included in the array;

decoding said defective memory element location from a binary signal representation to a thermometric signal representation; and loading said storage register with said thermometric signal representation of said defective memory location.

17. The method of claim 16, wherein:

said steering logic includes a series of multiplexing devices therein, said multiplexing devices capable of selectively routing data lines in the memory array to corresponding data lines in said I/O device.

18. The method of claim 17, wherein:

if a first defective data line from a series of data lines in the memory array is detected, then said first defective data line is not coupled to its corresponding data line in said I/O device; and data lines subsequent to said first defective data line in the memory array are coupled to corresponding data lines in said I/O device in accordance with a one position shift.

19. The method of claim 18, wherein:

if a second defective data line from said series of data lines in the memory array is detected, then said second defective data line is not coupled to its corresponding data line in said I/O device; and data lines subsequent to said second defective data line are coupled to corresponding data lines in said I/O device in accordance with a two position shift.

20. The method of claim 15, further comprising:

configuring carrying logic with said storage register, said storage register providing a first switching signal to said steering logic network and said carrying logic providing a second switching signal to said steering logic network;

wherein said first and second switching signals determine whether a data line in the memory array is connected in a first, second or third position with respect to a corresponding data line in said I/O device.

* * * * *